United States Patent [19]

Poponiak et al.

[11] Patent Number: 4,542,579
[45] Date of Patent: Sep. 24, 1985

[54] METHOD FOR FORMING ALUMINUM OXIDE DIELECTRIC ISOLATION IN INTEGRATED CIRCUITS

[75] Inventors: Michael R. Poponiak, Newburgh; Robert O. Schwenker, Hopewell Junction, both of N.Y.

[73] Assignee: International Business Machines Corporation, Armonk, N.Y.

[21] Appl. No.: 592,150

[22] Filed: Jun. 30, 1975

[51] Int. Cl.⁴ .................. H01L 21/20; H01L 21/76
[52] U.S. Cl. .................... 29/576 W; 29/578; 29/580; 148/175; 148/187; 148/DIG. 85; 148/DIG. 117; 204/15; 204/34.5; 204/42; 204/129.35; 357/40; 357/49; 357/50
[58] Field of Search .............. 148/175, 187; 357/40, 357/49, 50; 29/569, 576 W, 580, 578; 204/15, 42, 32 S–34 S, 129.35

[56] References Cited

U.S. PATENT DOCUMENTS

| | | | |
|---|---|---|---|
| 3,386,865 | 6/1968 | Doo | 147/175 |
| 3,500,139 | 3/1970 | Frouin et al. | 357/49 X |
| 3,539,876 | 11/1970 | Feinberg et al. | 357/48 X |
| 3,634,203 | 1/1972 | McMahon et al. | 204/15 |
| 3,671,819 | 6/1972 | Swanson | 204/15 X |
| 3,723,258 | 3/1973 | Podell et al. | 204/15 |
| 3,919,060 | 11/1975 | Pogge et al. | 357/49 X |
| 4,005,452 | 1/1977 | Cook | 357/49 |

FOREIGN PATENT DOCUMENTS 48-96086 12/1973 Japan .
50-63881 5/1975 Japan .

OTHER PUBLICATIONS

Cook et al., "Anodic Aluminum Isolation", Proc. Electron Devices Mtg., Wash., D.C., Nov. 17, 1974, pp. 266–269.
Doo et al., "Making Monolithic . . . Isolation Techniques", I.B.M. Tech. Discl. Bull., vol. 8, No. 4, Sep. 1965, pp. 659–660.
Deines, J. L., "Device Etching for Microscope Sample Preparation", I.B.M. Tech. Discl. Bull., vol. 15, No. 2, Jul. 1972, pp. 682–683.

*Primary Examiner*—William G. Saba
*Attorney, Agent, or Firm*—Mitchell S. Bigel; Robert J. Haase; J. B. Kraft

[57] ABSTRACT

In the fabrication of integrated circuits, a method is provided for forming dielectrically isolated regions in a semiconductor substrate comprising forming over the semiconductor substrate surface an electrically insulating layer of dielectric material having a plurality of openings therethrough and etching to form recesses in the semiconductor substrate exposed in the openings. Then, aluminum is deposited over the substrate so that an aluminum layer is formed on said layer of dielectric material as well as in said recesses. Next, the aluminum in the recesses is selectively anodized to form aluminum oxide, and the remaining aluminum on said layer of dielectric material is removed either by selectively etching away the aluminum layer or by a "lift-off" technique wherein the insulating layer of dielectric material under the aluminum is etched away thereby "lifting-off" and removing the aluminum.

10 Claims, 22 Drawing Figures

METHOD FOR FORMING ALUMINUM OXIDE DIELECTRIC ISOLATION IN INTEGRATED CIRCUITS

BACKGROUND OF INVENTION

With the ever increasing microminiaturization of semiconductor integrated circuits, and thus increasing lateral semiconductor device densities in integrated circuits, in recent years a major portion of the integrated circuit art has been moving in the direction of utilizing various forms of lateral dielectric isolation in order to laterally electrically isolate the densely packed devices from each other.

One approach for forming lateral dielectric isolation which has been increasingly utilized in the art involves the formation of recessed silicon dioxide lateral isolation regions, usually in the epitaxial layer where the semiconductor devices are to be formed, through the expedient of first selectively etching a pattern of recesses in the layer of silicon, and then thermally oxidizing the silicon in the recesses with appropriate oxidation blocking masks, e.g., silicon nitride masks, to form recessed or inset regions of silicon dioxide which provide the lateral electrical isolation. Representative of the prior art teaching in this area are U.S. Pat. No. 3,648,125 and an article entitled, "Locos Devices", E. Kooi et al, Philips Research Report 26, pp. 166–180 (1971).

While this approach has provided good lateral dielectric isolation, it has encountered some problems. Originally, the art applied the silicon nitride masks directly onto the silicon substrates. This gave rise to problems associated with high stresses created on the underlying silicon substrate by the silicon nitride-silicon interface. Such stresses were found in many cases to produce dislocations in the silicon substrate which appear to result in undesirable leakage current pipes and otherwise adversely affect the electrical characterisitics of the interface. In order to minimize such interface stresses with silicon nitride layers, it has become the practice in the art to form a thin layer of silicon dioxide between the silicon substrate and the silicon nitride layer. During such thermal oxidation, there is a substantial additoinal lateral penetration of silicon oxide from the thermal oxidation beneath the silicon nitride. This lateral penetration is greatest at the mask-substrate interface to provide a laterally sloping structure known and recognized in the prior art as the undesirable "bird's beak".

The publications, "Local Oxidation of Silicon; New Technological Aspects," by J. A. Appels et al, Philips Research Report 26, pp. 157–165, June 1971, and "Selective Oxidation of Silicon and Its Device Application", E. Kooi et al, *Semiconductor Silicon* 1973, published by the Electrochemical Society, Edited by H. R. Huff and R. R. Burgess, pp. 860–879, are representative of the recognition in the prior art of the "bird's beak" problems associoted with silicon dioxide-silicon nitride composite masks, particularly when used in the formation of recessed silicon dioxide by thermal oxidation.

Another approach to the formation of dielectric lateral isolation in integrated circuits is the "etch and refill" technique. By this approach, recesses are etched in the desired isolation pattern in the substrate, and dielectric materials such as silicon dioxide which can be formed by chemical vapor deposition are deposited over the surface of the substrate, thus filling the recesses as well as depositing over the unrecessed portions of the substrate to the same height as in the recesses. This produces an undesirable corrugated effect of peaks and valleys. It is, of course, recognized in the art that in order to further utilize the structure in subsequent integrated circuit fabrication, planarization is necessary, i.e., the dielectric material such as silicon dioxide must be removed from the unrecessed portion of the substrate while being permitted to remain in the substrate recesses. One of the recognized shortcomings of such prior art "etch and refill" techniques has been the difficulty in achieving such planarization.

Another difficulty encountered with such "etch and refill" techniques has been ensuring that the deposited dielectric material completely fills the recess, particularly in the case of relatively deep and narrow recesses.

Finally, irrespective of the method utilized to form the recessed dielectric isolation, there have been indications that when the recessed dielectric material is silicon dioxide, there is a tendency for inversion to take place along the interface of any recessed silicon dioxide and a P-type silicon substrate due to a positive charge inherently encountered in silicon dioxide Also in bipolar devices where P-type regions such as the base abut the recessed silicon oxide, there is a tendency for such an inversion to occur, creating a leakage path across the region.

SUMMARY OF THE PRESENT INVENTION

Accordingly, it is an object of the present invention to provide a method of integrated circuit fabrication utilizing recessed dielectric isolation regions which is free from "bird's beak" problems.

It is another object of the present invention to provide a method for integrated circuit fabrication utilizing recessed dielectric isolation formed by filling in etched recesses wherein material deposited on the unrecessed portions of the substrate during the filling of the recesses is readily and efficiently removed.

It is a further object of the present invention to provide a method for integrated circuit fabrication utilizing recessed dielectric isolation which is free of any silicon inversion problems along the recessed dielectric isolation interface.

It is yet a further object of the present invention to provide an integrated circuit structure fabricated by a method having the above described advantages which structure is substantially free from any silicon inversion along the dielectric isolation-silicon interface.

In accordance with the method of the present invention, there is provided a method for forming dielectrically isolated regions in a semiconductor substrate comprising forming over the semiconductor substrate surface an electrically insulating layer of dielectric material having a plurality of openings therethrough and etching to recess the silicon substrate exposed in the plurality of openings. Then, aluminum is deposited over the substrate whereby a layer of aluminum is deposited in said recesses and on said layer of dielectric material. The aluminum in the recesses is anodized to form aluminum oxide, and the aluminum deposited on the layer of dielectric material is selectively removed.

The method of the present invention is most effective when the substrate is silicon.

For best results, the anodization is carried out in the conventional aqueous electrolytic solution with a positive bias voltage applied to the silicon substrate. In such a case, the aluminum in the recesses is subjected to the bias voltages and is, thereby, anodized to form aluminum oxide while the aluminum on the layer of dielectric material is electrically insulated from the silicon substrate and, thereby remains substantially unanodized. During this anodization step, the aluminum in the recesses when converted to aluminum oxide expands by about forty per cent of its additional volume, thereby ensuring that even in the case of relatively narrow and deep recesses, the aluminum oxide will fill even the lower portions of the recess.

Because of the differences in properties between aluminum and aluminum oxide, planarization of the integrated circuit may be readily achieved by applying an etchant which selectively etches the aluminum remaining unanodized above the substrate surface but does not effectively etch the aluminum oxide now filling the recesses.

Alternatively, the remaining aluminum may be removed by utilizing an etchant for the layer of dielectric material formed on the substrate surface to which etchant the aluminum oxide is resistant. This, in effect, "lifts-off" the aluminum on the layer of dielectric material being removed.

The resulting structure comprises a pattern of recessed aluminum oxide regions extending from one surface of a semiconductor substrate into the substrate to laterally enclose and dielectrically isolate pockets of the semiconductor substrate. The structure is substantially planar and free from inversion problems along the interface of the recessed aluminum oxide and even a P-type semiconductor substrate as well as the previously mentioned inversion of P-type regions abutting the recessed oxide.

In accordance with a further aspect of the present invention, it may be desired to ensure maximum adhesion between the recessed aluminum oxide regions and the silicon substrate. In such a case, just subsequent to the etching of the recesses, such recesses are subjected to a conventional thermal oxidation in order to thermally grow a very thin layer of silicon dioxide in the order of 200 Å and no greater than 500 Å in thickness prior to the deposition of the aluminum. In such a case, the thin silicon dioxide layer, will not serve to insulate the aluminum deposited in the recesses from the positive bias voltage applied to the silicon substrate during the anodization step, and thus will not prevent the aluminum in the recesses from being anodized to aluminum oxide.

The foregoing and other objects, features and advantages of the invention will be apparent from the following more particular description of the preferred embodiments of the invention, as illustrated in the accompanying drawings.

PREFERRED EMBODIMENTS OF THE PRESENT INVENTION

Figure 1A:
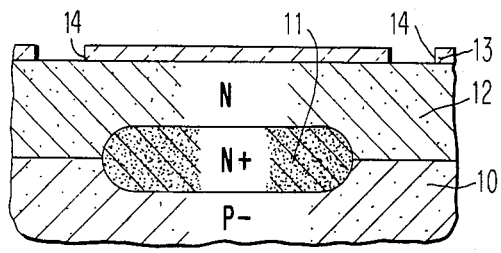
FIGS. 1A–1G are diagrammatic sectional views of a portion of an integrated circuit in order to illustrate the method of the preferred embodiment of the present invention.
Figure 1B:
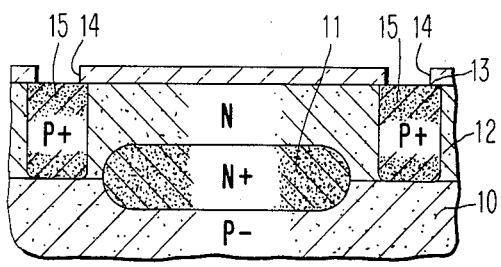

FIGS. 1A–1G illustrate the preferred embodiment of the present invention. On a suitable P− wafer 10 having a resistivity of 10 ohms/cm, an N+ region 11 which will subsequently serve as a buried subcollector is formed by conventional thermal diffusion of impurities as set forth for example in U.S. Pat. No. 3,539,876. When introduced into substrate 10, N+ region 11 has a surface concentration of $10^{21}$ atoms/cm$^3$. Region 11 may also be formed by conventional ion implantation techniques. After the formation of region 11, N-type layer 12 is formed by epitaxial deposition in the conventional manner, e.g., the method described in U.S. Pat. No. 3,539,876. Epitaxial layer 12 has a maximum doping level of $1 \times 10^{18}$ atoms/cm$^3$. During the deposition of the epitaxial layer. buried N+ subcollector region 11 out-diffuses up into the epitaxial layer as shown in FIG. 1A. Then, as shown in FIG. 1A, a layer of silicon dioxide 13, 1600 Å in thickness is formed in any conventional manner as described in the aforementioned patent, and openings 14 are selectively etched therein using conventional lithographic integrated circuit fabrication techniques. Then, P+ regions 15 are formed through the introduction of conductivity-determining impurities such as boron to a $C_0$ of $2 \times 10^{20}$ atoms/cm$^3$ to produce the structure shown in FIG. 1B. The P-type impurities may be introduced either by diffusion or ion implantation. Next, P+ regions 15 are selectively etched away through the application of etchant through openings 14. In order to expedite the etching, advantage is taken of the property of anodic etching to selectively etched highly doped regions such as P+ region 15 at a higher rate than the adjacent layer 12 having a lower doping level. The anodic etching step may be carried out in any conventional anodic etching apparatus such as that described in the IBM Technical Disclosure Bulletin, Vol. 15, No. 2, July 1972, page 682, in an article by J. L. Deines. In the anodic etching, the anode positive voltage is applied to substrate 10 while a platinum foil in a 5% HF aqueous solution serves as the cathode. During the anodic etching, the electrolyte is maintained at a current density of 0.1 amp/cm$^2$ and an applied voltage of six volts to produce recesses 16, FIG. 1C, extending to a depth of about 2 microns from the surface of silicon epitaxial layer 12 thereby extending through layer 12.

Figure 1C:
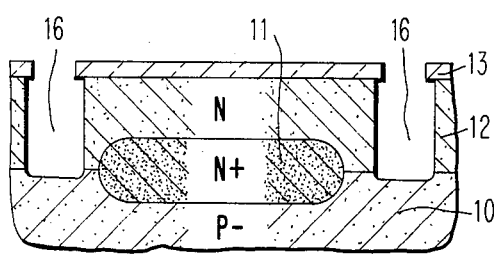
Figure 1D:
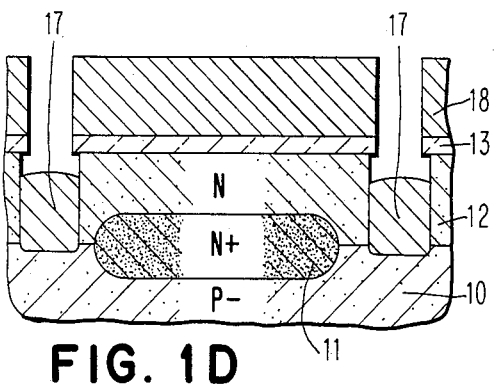

Then, FIG. 1D, a layer of aluminum about 1.5 microns in thickness is deposited over the structure to produce the layer shown in FIG. 1D, wherein aluminum layers 17 fill in the order of 70% of recesses 16 while aluminum layer portions 18 are deposited on silicon dioxide surface layer 13. Aluminum layers 17 and 18 may be deposited by any conventional techniqu for forming aluminum metallurgy in integrated circuits, e.g., the standard vacuum deposition techniques utilized in the process of U.S. Pat. No. 3,539,876.

Figure 1E:
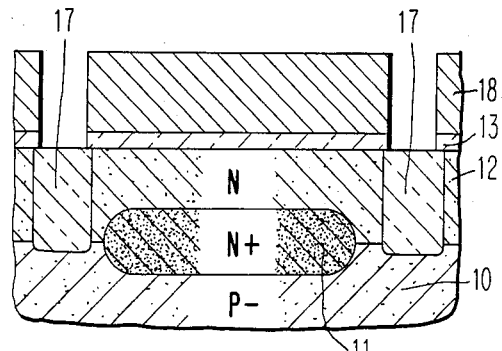
Figure 1F:
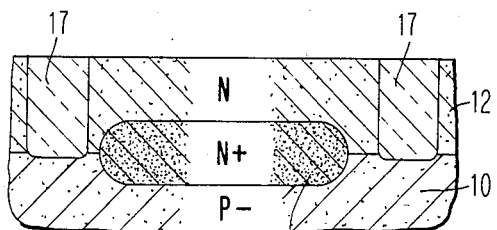

Then, FIG. 1E, aluminum deposits 17 in recesses 16 are anodized to form aluminum oxide regions 18. The anodization of aluminum may be carried out in the conventional manner, i.e in a standard electrolytic solution. A typical process and apparatus for this anodization is described in *Semiconductor Silicon*, 1973, *The Proceedings of the Electrochemical Society Conference* at Chicago, May 13, 1973, in an article by D. K. Seto, pp. 651–657, particularly FIG. 1 thereof. Apparatus which may be utilized in this anodization process are also described in the IBM Technical Disclosure Bulletin, July 1972, in an article by J. L. Deines, pp. 682–683. The wafers are contacted at the back side of the substrate with a positive applied voltage of about 10 V. An eight per cent aqueous solution of sulfuric acid serves as the electrolyte, and a platinum foil cathode can be used as the counterelectrode. The applied voltage is maintained at a constant value during the ionization which is allowed to proceed until the current decays to a density of less than 0.02 milliamps/cm$^2$.

During the anodization process, silicon dioxide layer 13 serves to insulate layer 18, the aluminum applied onto the surface from the positive voltage necessary for anodization in the electrolytic solution. Thus, very little, if any, anodization takes place in aluminum layer 18. Then, when an etchant which selectively etches aluminum and to which aluminum oxide is relatively resistant is subsequently applied, aluminum layer 18 is removed while anodized aluminum layer 18 in the recesses remains substantially intact to produce the structure shown in FIG. 1F.

Etchants for selectively removing aluminum and to which aluminum oxide is relatively resistant are described at pages 196 and 197 of the text, "Anodic Oxide Films", by L. Young, Academic Press, London and New York (1961). Such etchants include mercuric chloride solutions, solutions of bromine and iodine in methyl alcohol, and oxygen-free hydrochloric acid dissolved in absolute ether as well as mixtures of HF and nitric acid.

Figure 1G:
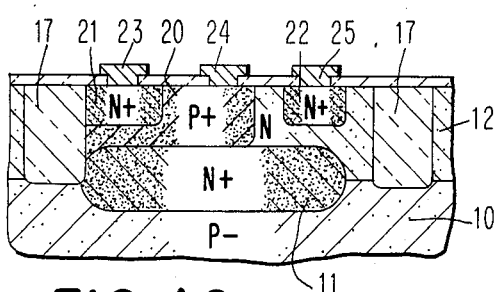

The processing of the bipolar integrated circuit is then completed to produce the structure shown in FIG. 1G by conventional integrated circuit fabrication techniques, e.g., those described in U.S. Pat. No. 3,539,876. In this final structure, P-type base region 20 abuts N+ subcollector 11 and N+ emitter region 21 is enclosed within base region 20. A collector contact 22 provides a path for contacting subcollector 11. Metallic contacts 23, 24 and 25 are respectively made to emitter, base and collector.

Figure 2A:
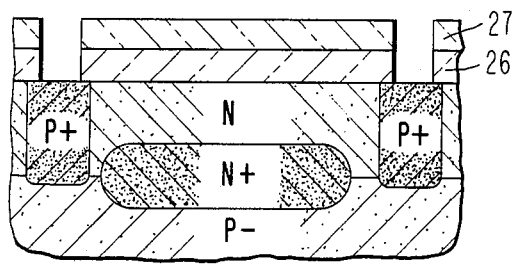
FIGS. 2A–2G are diagrammatic sectional views of an integrated circuit in order to illustrate the method of an additional embodiment of the present invention.

Another aspect of the present invention is shown with respect to FIGS. 2A–2G. In the variation shown, the removal o the unanodized aluminum is accomplished by a "lift-off" technique The structure shown in FIG. 2A is similar to that of FIG. 1B except that instead of a single layer of thermally grown silicon dioxide on the surface of the substrate, there is a composite of two layers of silicon dioxide: a lower layer 26, 1600 Å in thickness, prepared by the conventional thermal oxidation of the silicon substrate as described in U.S. Pat. No. 3,539,876, and a layer of silicon dioxide 27, 5000 Å in thickness deposited by the pyrolytic or chemical vapor deposition techniques, well known in the art and also described in U.S. Pat. No. 3,539,876.

Next, utilizing the same anodic etching techniques previously described with respect to FIG. 1C, recesses 28 are formed in the epitaxial layer.

It is recognized that for specific applications, it may be necessary to have a very high degree of adhesion of recessed aluminum oxide to the silicon epitaxial layer. In such a case, the following procedure may be utilized in order to increase the adhesion. Before the deposition of the aluminum into recesses 28, the structure is subjected to thermal oxidation conditions to grow a very thin layer 29 of silicon dioxide along the walls of recess 28 as shown in FIG. 2C. Layer 29 should be 200 Å or less in thickness. Next, FIG. 2D, aluminum is deposited using the procedures previously described with respect to FIG. 1D to form aluminum layers 30 in the recess and aluminum layers 31 on the surface of deposited silicon dioxide layer 27.

Then, following the procedures previously described with respect to FIG. 1D, aluminum layers in the recesses are anodized to form recessed aluminum oxide insets 32 while aluminum layer 31 remains substantially unanodized. This is possible because when the positive anodization voltage is supplied to the substrate, the thin layer 29 of silicon dioxide lining the recesses is insufficient to electrically insulate the aluminum layers in the recesses from the applied positive voltage while combined silicon dioxide layers 26 and 27 have a much greater thickness which is sufficient to electrically insulate aluminum layer 31 from this anodization voltage.

Figure 2E:
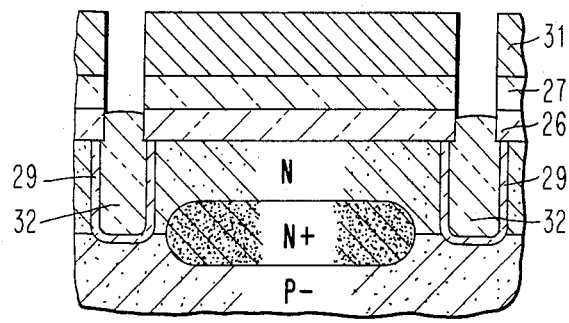
Figure 2B:
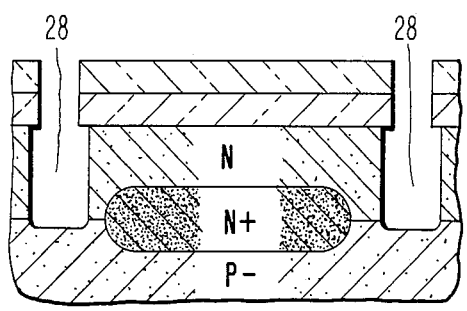
Figure 2F:
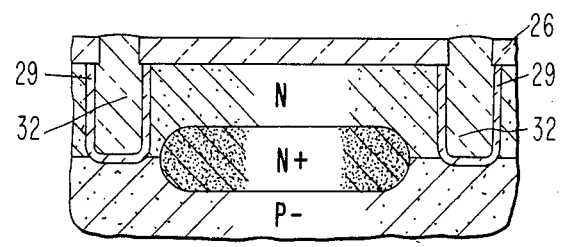
Figure 2C:
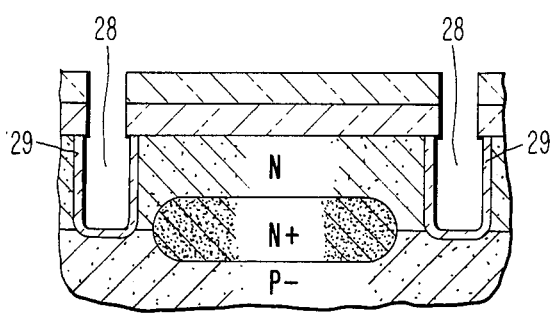

Next, FIG. 2F, aluminum layer 31 of FIG. 2E is removed by a "lift-off" process utilizing a chemical etching cycle which selectively attacks primarily deposited silicon dioxide layer 27, thus undercutting and eventually "lifting-off" aluminum layer 31. In "lifting-off" layer 31, a solution of HF can still be used but with a different etch cycle from that described with respect to FIG. 1. For example, utilizing a 10% aqueous HF solution which will etch deposited silicon dioxide layer 27 at a much higher rate than thermally grown silicon dioxide layers 26 and 29, deposited silicon dioxide layer is substantially removed undercutting and thereby removing aluminum layer 31 before there is any significant affect on thin silicon dioxide layer 29. Thus, aluminum oxide recessed regions 32 remain in tact in the final structure as shown in FIG. 2F.

Alternatively, the "lift-off" step of FIG. 2F may be carried out prior to the anodization of aluminum layer 30 to aluminum layer 32 and then followed by the same anodization step but after "lift-off". During this alternative, the 10% aqueous HF solution which etches away silicon dioxide layer 27 for "lift-off" will not, as known in the art, be an etchant for the aluminum layer 30 in the recess.

Figure 2G:
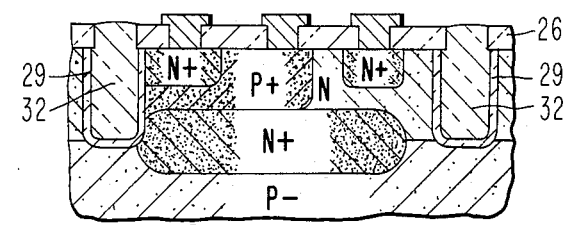

Then, the integrated circuit structure is completed to form bipolar devices as shown in FIG. 2G utilizing the procedures previously described with respect to FIG. 1G.

Figure 3A:
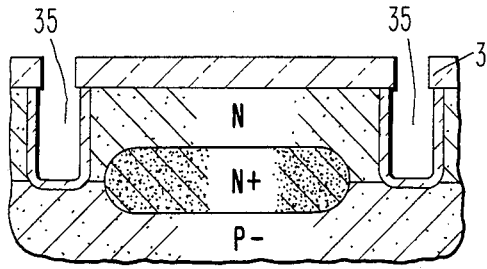
FIGS. 3A–3H are diagrammatic sectional views of an integrated ciecuit in order to illustrate the method of a further embodiment of the present invention.

In accordance with another embodiment of the present invention, upon the completion of the anodization, the remaining unanodized aluminum layer may be removed by utilizing standard photolithographic photoresist masked chemical etching techniques as will be described with respect to FIGS. 3A–3H. The structure shown in FIG. 3A is substantially the same as that shown in FIG. 2C except that it is covered with a single layer 33, about 5000 Å in thickness, of thermally grown silicon dioxide in place of composite layers 26 and 27.

Figure 2D:
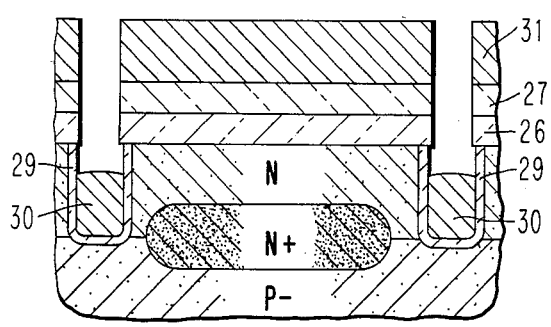
Figure 3B:
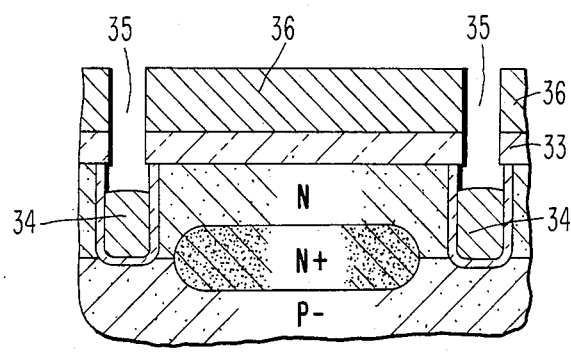
Figure 3C:
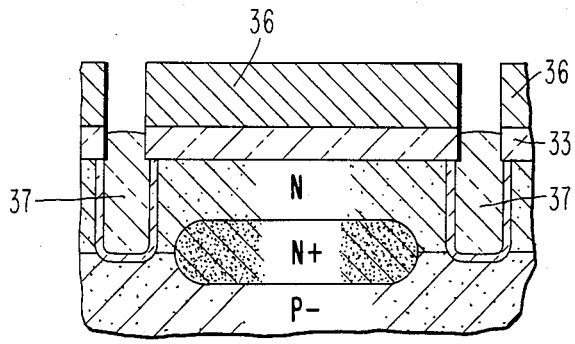

Then, utilizing the procedures previously described with respect to FIGS. 1D and 2D a layer of aluminum 1.5 microns in thickness is deposited in recesses 35 as layer 34 and as layer 36 on the surface of silicon dioxide layer 33, FIG. 3B. The selective anodization is then carried out utilizing the procedures previously described with respect to FIGS. 1E and 2E to produce aluminum oxide 37 within recesses 35 while silicon dioxide layer 33 is of sufficient thickness to electrically insulate aluminum layer 36 which remains substantially unanodized to produce the structure shown in FIG. 3C.

Figure 3D:
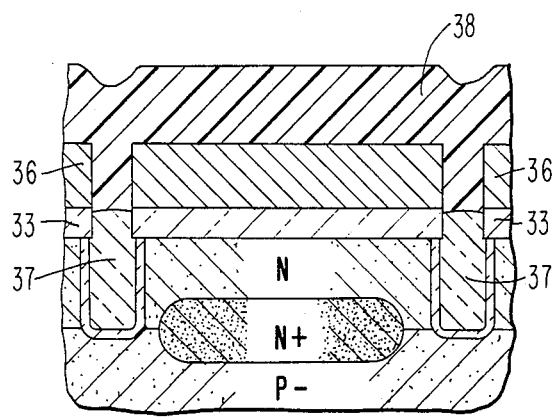
Figure 3E:
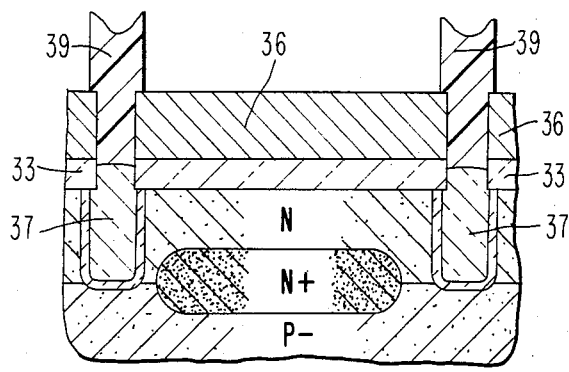

Then, FIG. 3D, utilizing conventional integrated circuit photolithographic fabrication techniques, e.g., as described in U.S. Pat. No. 3,539,876, a layer of photoresist 38 2 microns in thickness is deposited over the surface of the substrate and with standard masking techniques the photoresist is removed to leave only photoresist regions 39 deposited over aluminum oxide regions 37, FIG. 3E.

Figure 3F:
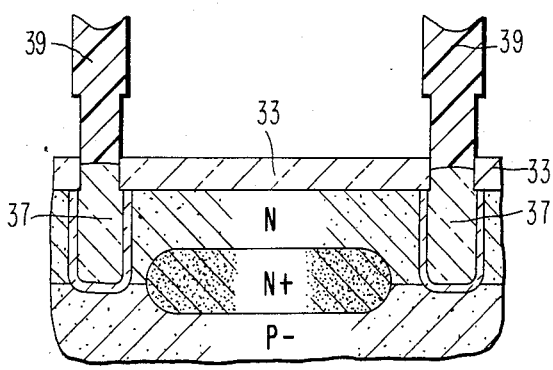

Then, FIG. 3F, utilizing any conventional etchant for aluminum such as a standard hot phosphoric acid etchant, aluminum layer 36 is removed while photoresist regions 39 protect underlying aluminum oxide regions 37. The primary advantage of this approach is that the aluminum oxide in the recess remains fully protected during the etch cycle rather than being subjected to a selective etch technique wherein it must display a higher resistivity to the etchant than either the aluminum or the layer under the aluminum in a "lift-off" procedure. The primary limitation, however, of this approach is that it requires what is in effect a second masking and alignment step for the photoresist with respect to the aluminum oxide regions 37. In any event, we have what in effect amounts to a "trade-off" of relative advantages. Thus, the approach utilized may be selected between the selective etching approaches described in FIGS. 1 and 2 and the mask alignment approach described with respect to FIG. 3 dependent on the need and limitations of the particular integrated circuit fabrication being carried out.

Figure 3G:
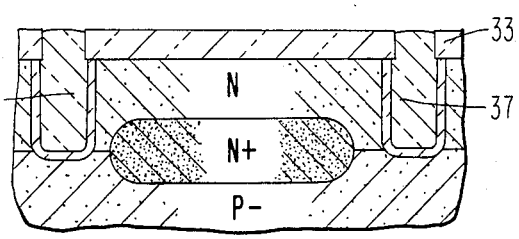
Figure 3H:
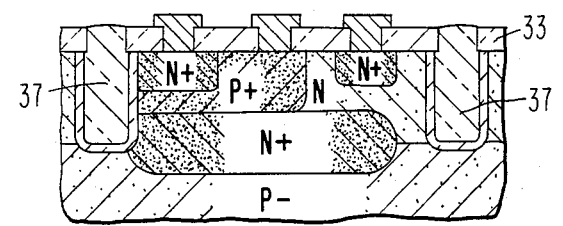

With respect, then, to FIG. 3G, the photoresist regions 39 are removed. Then, utilizing conventional bipolar transistor integrated circuit fabrication techniques as described with respect to FIGS. 1G and 2G, the integrated circuit is completed to produce the structure shown in FIG. 3H.

In practicing the process of FIGS. 3A–3H, a composite layer structure such as silicon nitride formed over silicon dioxide may be used in place of layer 33. Also, layer 33 may be silicon oxynitride.

It should further be noted with respect to the fabrication of bipolar integrated circuits that when utilizing an N-type epitaxial layer on a P− substrate as in the structure shown in FIGS. 1, 2 and 3, is recognized in the art that an inversion of the P− material may take place around the bottom of any dielectric isolation extending into the P− substrate which would form an N-channel around the bottom of the dielectric isolation, perhaps shorting together two adjacent bipolar devices. A conventional expedient in the art to prevent this may be incorporated into the present structure. As described in U.S. Pat. No. 3,858,231, prior to the growth of the N-type epitaxial layer in FIGS. 1A, 2A or 3A, a pair of P+ regions may be introduced into the substrate on either side of the N+ subcollector and substantially in alignment with the subsequently to be formed aluminum oxide regions. Then, when the aluminum oxide regions are subsequently formed, they will extend into contact with these P+ regions which will serve to prevent any inversion of the P− substrate around the bottom of the recessed aluminum oxide. Alternatively, these P+ regions may be introduced into the substrate just subsequent to the formation of the recess in, for example, either steps of FIG. 1C or 2B by introducing a P+ region through the bottom of the recesses into the P− substrate.

In the embodiments shown, the aluminum oxide has been shown to be substantially completed in formation prior to the formation of the integrated circuit devices in the epitaxial layer. It should be recognized that because of the relatively low temperatures utilized in the present process for formation of the aluminum oxide, e.g., the highest temperatures are in the order of 200° C. during deposition of aluminum, the aluminum oxide, particularly when utilizing the procedure of FIGS. 1A–1G, may be formed subsequent to the formation of device regions such as the base or emitter regions because these highest temperatures during deposition of the aluminum are not high enough to affect any shift of any of the PN junctions in previously formed device regions.

While the invention has been particularly shown and described with reference to the preferred embodiments thereof, it will be understood by those skilled in the art that various changes in form and details may be made therein without departing from the spirit and scope of the invention.

What is claimed is:

1. In the fabrication of integrated circuits, a method for forming dielectrically isolated regions in a semiconductor substrate comprising the steps of:
    forming over said semiconductor substrate surface, an electrically insulating layer of dielectric material having a plurality of openings therethrough,
    etching to form recesses in the semiconductor substrate exposed in said openings,
    forming a thin layer of silicon dioxide in said recesses, said thin layer of silicon dioxide having a maximum thickness of 200 Å,
    depositing aluminum on said layer of dielectric material and depositing aluminum spaced therefrom in said recesses,
    fully anodizing the aluminum in said recesses in an aqueous electrolytic solution, by applying a positive bias voltage to said semiconductor substrate to thereby subject the aluminum in said recesses to said bias voltage and anodize the aluminum in said recesses to aluminum oxide, the thickness of said thin layer of silicon dioxide being insufficient to insulate the aluminum in said recesses from said positive bias voltage, the thickness of said electrically insulating layer of dielectric material being sufficient to electrically insulate the aluminum thereon from said positive bias voltage so that it remains substantially unanodized, and
    removing the aluminum deposited on said layer of dielectric material.

2. The method of claim 1 wherein said semiconductor substrate is silicon.

3. The method of claim 1 wherein the aluminum deposited on the layer of dielectric material is removed by the application of an etchant for aluminum to which aluminum oxide is resistant.

4. The method of claim 1 wherein the aluminum deposited on the layer of the dielectric material is removed by applying an etchant for said layer of dielectric material to which the aluminum oxide is resistant.

5. The method of claim 1 wherein said aluminum deposited on said layer of dielectric material is removed prior to the anodization by the application of an etchant for the dielectric material to which aluminum is resistant.

6. The method of claim 1 wherein said dielectric material is silicon dioxide.

7. The method of claim 1 including the further step of diffusing conductivity-determining impurities in the semiconductor substrate subsequent to the anodization of the aluminum.

8. The method of claim 1 wherein said thin layer of silicon dioxide in said recesses is formed in situ by thermal oxidation, and said electrically insulating layer of dielectric material is deposited silicon dioxide.

9. The method of claim 8 wherein said aluminum deposited on the substrate surface layer of deposited silicon dioxide is removed by applying an etchant which selectively etches deposited silicon dioxide at a faster rate than it etches the silicon dioxide formed in the recesses by thermal oxidation or the aluminum oxide in said recesses.

10. In the fabrication of integrated circuits, a method for forming dielectrically isolated regions in a semiconductor substrate comprising the steps of:

forming over said semiconductor substrate surface, an electrically insulating layer of dielectric material having a plurality of openings therethrough, etching to form recesses in the semiconductor substrate exposed in said openings, forming a thin layer of silicon dioxide in said recesses, said thin layer of silicon dioxide having a maximum thickness of 200 Å, depositing aluminum on said layer of dielectric material and depositing aluminum spaced therefrom in said recesses, fully anodizing the aluminum in said recesses in an aqueous electrolytic solution, by applying a positive bias voltage to said semiconductor substrate to thereby subject the aluminum in said recesses to said bis voltage and anodize the aluminum in said recesses to aluminum oxide, the thickness of said thin layer of silicon dioxide being insufficient to insulate the aluminum in said recesses from said positive bias voltage, the thickness of said electrically insulating layer of dielectric material being sufficient to electrically insulate the aluminum thereon from said positive bias voltage so that it remains substantially unanodized.

* * * * *